United States Patent [19]

Yazawa et al.

[11] 4,438,405
[45] Mar. 20, 1984

[54] FREQUENCY DISCRIMINATING DEVICE

[75] Inventors: Nobuharu Yazawa; Yasunori Sakaguchi, both of Itami, Japan

[73] Assignee: Nippon Gijutsu Boeki Co., Ltd., Tokyo, Japan

[21] Appl. No.: 292,273

[22] Filed: Aug. 12, 1981

[30] Foreign Application Priority Data

Aug. 12, 1980 [JP] Japan .................... 55-110521
Aug. 12, 1980 [JP] Japan .................... 55-110525
May 8, 1981 [JP] Japan .................... 56-69617

[51] Int. Cl.³ .................... H03B 19/00; H04Q 3/00; H03K 5/26
[52] U.S. Cl. .................... 328/152; 328/137; 328/25; 307/243; 307/524; 340/825.71; 340/825.7
[58] Field of Search .................... 328/133, 134, 138, 137, 328/140, 25, 152; 307/524, 525, 510, 522, 231, 243; 340/825.58, 825.7, 825.71; 455/150, 154

[56] References Cited

U.S. PATENT DOCUMENTS

| | | | |
|---|---|---|---|
| 3,388,333 | 6/1968 | Scribner | 328/133 |
| 3,588,711 | 6/1971 | Antoszewski | 328/140 |
| 3,812,432 | 5/1974 | Hanson | 328/140 |
| 4,231,018 | 10/1980 | Imigawa et al. | 340/825.71 |
| 4,305,061 | 12/1981 | Nakamura | 340/825.71 |

*Primary Examiner*—John S. Heyman
*Assistant Examiner*—Timothy P. Callahan
*Attorney, Agent, or Firm*—Staas & Halsey

[57] ABSTRACT

A frequency discriminating circuit for readily discriminating between two signals having closely adjacent frequencies in which the effects of drift of circuit elements are eliminated. A frequency mixer receives the signals to be discriminated which have closely adjacent frequencies $f_1$ and $f_2$ and a reference signal with a frequency of $f_m$. A first low-pass filter coupled to an output of the mixer produces an output signal containing only frequency difference components $|f_1-f_m|$ and $|f_2-f_m|$ between the signal to be discriminated and the reference signal. The output of the first low-pass filter is passed through a second low-pass filter. A phase comparator receives the output signals from the first and second low-pass filters and discriminates the input signals in accordance with a phase difference between the output signals from the first and second low-pass filters.

10 Claims, 13 Drawing Figures

FREQUENCY DISCRIMINATING DEVICE

BACKGROUND OF THE INVENTION

The invention relates to a frequency descriminating device which can readily discriminate two signals having similar frequencies.

Heretofore, in order to discriminate two signals having closely adjacent frequencies $f_1$ and $f_2$, filters having passbands which pass only the specific frequencies were employed, or the phase characteristic of a filter was utilized. For instance, a circuit as shown in FIG. 1 was used. In FIG. 1, reference numeral 1 designates a low-pass filter, 2 a phase comparator, and a and b an input terminal and an output terminal, respectively.

In the circuit, the signals to be discriminated are applied directly to the phase comparator 2 and applied through the low-pass filter 1 (which may be a high-pass filter) to the phase comparator 2. As is apparent from the characteristic curve of phase versus frequency as shown in FIG. 2, the phase conditions at the frequencies $f_1$ and $f_2$ are different. Accordingly, the signals applied to the phase comparator 2 through the low-pass filter 1 are different in phase from the original signals. This variation in phase is detected as an output by the phase comparator 2.

In FIG. 1, the low-pass filter 1 is, for example, a two-pole low-pass filter which rolls off at −12 dB/oct. Therefore, in that case, for the frequencies $f_1$ and $f_2$, discrimination can be achieved by phase detection of 0° and 180°. However, the Q characteristic of the low-pass filter 1 must be steep, otherwise the phase variation will be small and accordingly the discrimination rather difficult. On the other hand, if the frequencies $f_1$ and $f_2$ are very close to each other, it is difficult to sufficiently accurately set a cut-off frequency for the low-pass filter. If the drift of the circuit elements is taken into account, then it is often impossible to employ this technique.

The present invention further relates to a frequency discriminating device which discriminates an amplitude-modulated signal (hereinafter referred to as "AM") using one of two adjacent frequencies, as in the case of a control signal for television sound multiplex broadcasts.

A conventional frequency discriminating device of this type is shown in FIG. 3. In FIG. 3, reference numeral 11 designates an input terminal to which is applied an AM input signal modulated by one of two adjacent frequencies, 12 a limiter connected to the input terminal 11, 13 a frequency divider connected to the limiter 12, 14 a frequency mixer which receives the AM input signal and the output signal of the frequency divider 13, 15 a first low-pass filter for obtaining the difference component between the output signal of the freuquency divider 13 and the modulation frequency of the AM input signal, 16 a second low-pass filter, 17 a phase comparator, and 18 an output terminal.

The device thus constructed operates as follows: It is assumed that the carrier frequency of the AM input signal is represented by $f_c$ and the modulation signal of the AM input signal is represented by $f_1$ or $f_2$. Upon applying the AM input signal to the limiter 12 and the frequency divider 13, a reference signal is obtained. The frequency of the reference signal can be represented by the following expression:

$$f_m = f_c/N, \qquad (1)$$

where N is the frequency division ratio of the frequency divider.

After the AM input signal and the reference signal are applied to the frequency mixer 14, only the difference component between the two signals is obtained at the output of the first low-pass filter 15. Therefore, the output signal of the first low-pass filter 15 has a frequency component $f_1 - f_m$ or $f_2 - f_m$.

This output signal is applied to the second low-pass filter, which has a characteristic as shown in FIG. 4. A phase inversion between the signals $|f_1 - f_m|$ and $|f_2 - f_m|$ is performed by the second low-pass filter 16 due to its having a cut-off frequency $f_o$ between $|f_1 - f_m|$ and $|f_2 - f_m|$. Thus, by applying the output of the first low-pass filter 15 directly to the phase comparator 17 and by applying the same through the second low-pass filter 16 to the phase comparator 17, it can be discriminated whether the modulation frequency is $f_1$ or $f_2$.

For instance, in an actual television sound multiplex broadcast (as used in Japan), the carrier frequency $f_c$ is 55.125 kHz and the modulation frequency is 982.5 Hz ($f_1$) for stereo broadcasts and 922.5 Hz ($f_2$) for split-channel (bilingual) broadcasts. If the frequency division ratio is 61, then the reference signal $f_m$ has a frequency of 903.7 Hz. Thus, $|f_1 - f_m|$ and $|f_2 - f_m|$ are 78.8 Hz and 18.8 Hz, respectively. (If N is 55, then $f_m$ is 1002.3 Hz, and therefore $|f_1 - f_m|$ is 19.8 Hz and $|f_2 - f_m| = 79.8$ Hz as opposed to the above-described case.) The first low-pass filter 15 is set to pass a frequency band lower than 100 to 200 Hz. In the case of the frequency division ratio N=61, the signal at 78.8 Hz for stereo broadcasts and the signal at 18.8 Hz for bilingual broadcasts are discriminated. If the cut-off frequency $f_o$ of the second low-pass filter 16 is set to 40 to 50 Hz, then these signals can be clearly discriminated by the phase comparator 17. Since the second low-pass filter 16 is utilized only for phase inversion, it is evident that the same effect can be obtained by using a high-pass filter.

However, in the conventional device, not only a phase inversion but also a signal level drop takes place on the $f_1 - f_m$ side in the second low-pass filter as shown in FIG. 4. Therefore, the conventional device suffers from a drawback in that, if an AM input signal having a low S/N ratio because of low received electric field strength, etc. is applied, it cannot be clearly discriminated.

In a further example of the prior art shown in FIG. 5, a selective amplifier 41 amplifies only an AM signal at 55.125 kHz, and the signal at 922.5 Hz or 982.5 Hz is obtained through an AM detector 42. The signal thus obtained is applied to a reed filter 43a or 43b to detect the frequency thereof. A level detector 44a or 44b provides an output.

The output as a result of AM detection includes a great deal of noise, and the difference between the frequencies 992.5 Hz and 982.5 Hz is only 60 Hz. Therefore, the filters must be have excellent and stable frequency characteristics. Accordingly, reed filters are employed. However, even reed filters does not have fully acceptable response characteristics and vibration withstanding characteristic due to the mechanical construction thereof.

In view of the foregoing, an object of the invention is to provide a frequency discriminating device having a wide range of applications.

SUMMARY OF THE INVENTION

Accordingly, the invention provides a frequency discriminating device including a frequency mixer receiving signals to be discriminated having adjacent frequencies of $f_1$ and $f_2$ and a reference signal having frequency of $f_m$, a first low-pass filter coupled to an output of the mixer for producing an output signal having only frequency difference components $|f_1-f_m|$ and $|f_2-f_m|$ between the signal to be discriminated and the reference signal, a second low-pass filter having an input coupled to an output of the first low-pass filter, and a phase comparator receiving the output signal from the first low-pass filter directly and an output signal from the second low-pass filter for thereby discriminating the signals in accordance with a phase difference between the output signals thus received.

In an another embodiment, the frequency discriminating device includes a first frequency divider for frequency dividing a carrier signal of a received signal which is amplitude-modulated with one of two adjacent frequencies, a frequency mixer receiving a frequency-divided output from the first frequency divider and the amplitude modulated signal, a first low-pass filter coupled to an output of the frequency mixer which passes only a difference component between the frequency of the output of the first frequency divider and the modulation frequency of the amplitude-modulated signal, a second filter having an input coupled to an output of the first low-pass filter, a phase comparator receiving the output of the first low-pass filter and the output of the second filter for detecting a phase difference therebetween, a second frequency divider for frequency dividing the output of the second filter, and a frequency division ratio switching circuit receiving a frequency divided output of the second frequency divider and the output of the phase comparator for setting a frequency division ratio of the first frequency divider.

In a further embodiment, the invention provides a frequency discriminating device specifically intended for use in a television sound multiplex broadcast system in which a stereo broadcast for a split-channel broadcast such as a bilingual program is discriminated by an amplitude-modulated control signal. The device includes a limiter receiving the amplitude-modulated carrier signal, a frequency divider for frequency-dividing the carrier signal of the control signal output by the limiter, a mixer receiving as inputs the output of the frequency divider and the amplitude-modulated control signal, a first low-pass filter for passing from the output signal of the mixer only a frequency component between the output of the frequency divider and a modulation signal, a second low-pass filter receiving an output from the first low-pass filter, and a phase comparator receiving the output of the first low-pass filter and the output of the second low-pass filter for discriminating the phase difference therebetween.

DESCRIPTION OF THE PREFERRED EMBODIMENTS

Figure 6:
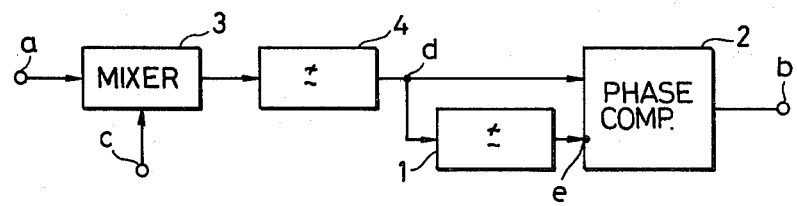
FIG. 6 is a block diagram showing a first preferred embodiment of a frequency discriminating circuit of the invention.

FIG. 6 is a block diagram showing a first preferred embodiment of a filter circuit of the invention. In FIG. 6, reference numeral 1 designates a second low-pass filter, 2 a phase comparator, 3 a frequency mixer, and 4 a first low-pass filter. Input frequencies $f_1$ and $f_2$ to be discriminated are applied through an input terminal a to the frequency mixer. On the other hand, a reference signal having a frequency $f_m$ is applied to another input terminal c of the frequency mixer 3. As a result, the frequency mixer 3 provides an output having frequency components $|f_1+f_m|$, $|f_2+f_m|$, $|f_1-f_m|$ and $|f_2-f_m|$. Out of these frequency components, only the frequency components $|f_1-f_m|$ and $|f_2-f_m|$ are passed by the first low-pass filter 4. The output of the low-pass filter 4 is applied directly to the phase comparator 2 and also applied through the second low-pass filter 1 to the phase comparator 2. The cut-off frequency $f_o$ of the second low-pass filter 1 is set to be between $|f_1-f_m|$ and $|f_2-f_m|$.

This filter is equivalent to a conventional filter in which frequencies $f_1$ and $f_2$ are subjected directly to phase comparison. However, it should be noted that in the conventional case, the frequencies $f_1$ and $f_2$ are very close to each other and accordingly when the value $|f_1-f_2|/f_1$ in percentage is of the order of several percent, it is difficult to accurately set the cut-off frequency $f_o$. On the other hand, in the case of the invention, the cut-off frequency is determined by $|f_1-f_m|$ and $|f_2-f_m|$, and therefore if $f_m \approx f_2$, then $|f_2-f_m|$ can be set to a very small value and accordingly the ratio $|f_1-f_m|/|f_2-f_m|$ can be set to a large value. Accordingly, the cut-off frequency $f_c$ can be readily set. With this construction, variations and drifts of capacitors and resistors which are externally connected are reduced in significance.

Figure 7:
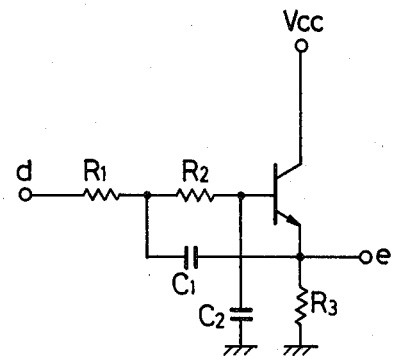
FIG. 7 is a schematic diagram showing an example of a low-pass filter in the circuit of FIG. 6.
Figure 8:
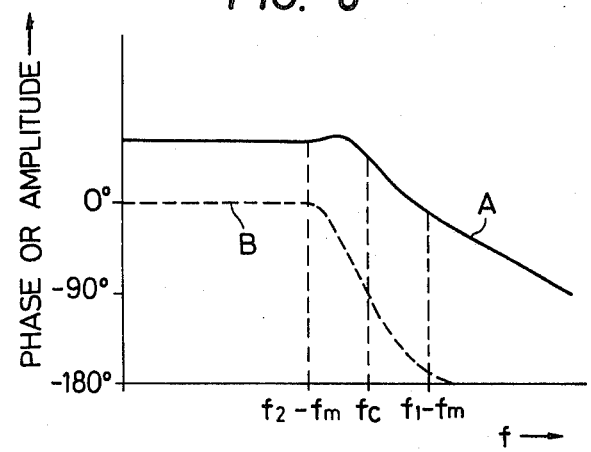
FIG. 8 is a graphical representation of characteristics of the low-pass filter of FIG. 7.

A specific example of a two-pole RC type active filter 1 is shown in FIG. 7. In FIG. 7, reference characters $R_1$, $R_2$ and $R_3$ designate resistors, $C_1$ and $C_2$ capacitors, $V_{cc}$ a power source, and d and e terminals corresponding to terminals d and e in FIG. 6. In this case, the cut-off frequency $f_c$ is represented by $\frac{1}{2}\sqrt{(R_1R_2C_1C_2)}$, and the frequency response characteristics are as shown in FIG. 8. In FIG. 8, the curve A indicates the amplitude characteristic curve and the curve B indicates the phase characteristic curve. As is apparent from FIG. 8, with respect to $|f_2-f_m|$ and $|f_1-f_m|$, the phase changes over a range of from 0° to 180°. Thus, by setting the reference frequency $f_m$ so that the difference between $|f_2-f_m|$ and $|f_1-f_m|$ is as large as possible, a frequency discriminating circuit which is little affected by variations of capacitors and resistors and by the Q-characteristics of the filters is provided.

As was described in detail, in the invention, in order to discriminate adjacent frequencies $f_1$ and $f_2$, a reference signal having a frequency of $f_m$ is employed so that the frequency mixer provides an output signal having frequency components $|f_1-f_m|$ and $|f_2-f_m|$ which are selected by the first low-pass filter. The output of the filter is applied directly to the phase comparator and applied through the second low-pass filter to the same comparator where the outputs thus applied are subjected to comparison. Accordingly, the ratio $|f_1-f_m|/|f_2-f_m|$ can be set to a large value. Thus, the cut-off frequency of the second low-pass filter can be readily set. Therefore, the frequency discriminating device of the invention is advantageous in that it can discriminate closely adjacent frequencies with a high accuracy and its operation is not affected by variations or drift of externally connected resistors and capacitors.

A second embodiment of the invention will be described with reference to FIG. 9.

Figure 3:
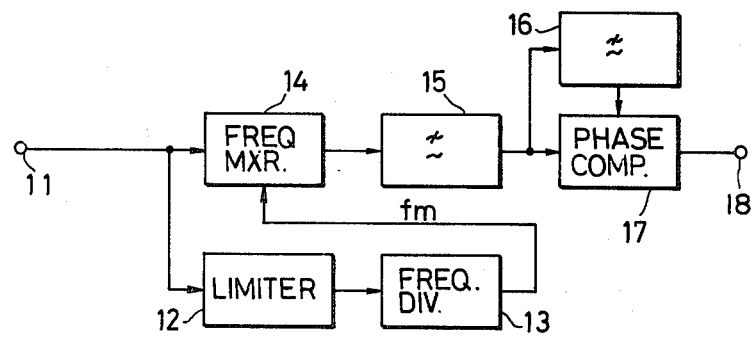
FIG. 3 is a block diagram showing another conventional frequency discriminating circuit.
Figure 4:
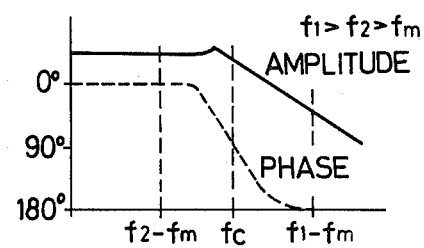
FIG. 4 is a graphical representation of the characteristic of a low-pass filter in the circuit of FIG. 3.
Figure 5:
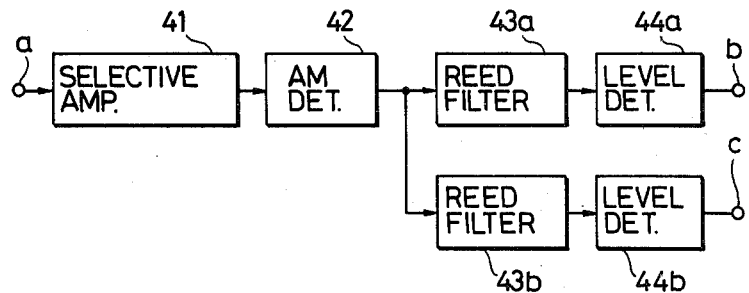
FIG. 5 is a block diagram showing another conventional frequency discriminating circuit for a sound multiplex broadcast.
Figure 9:
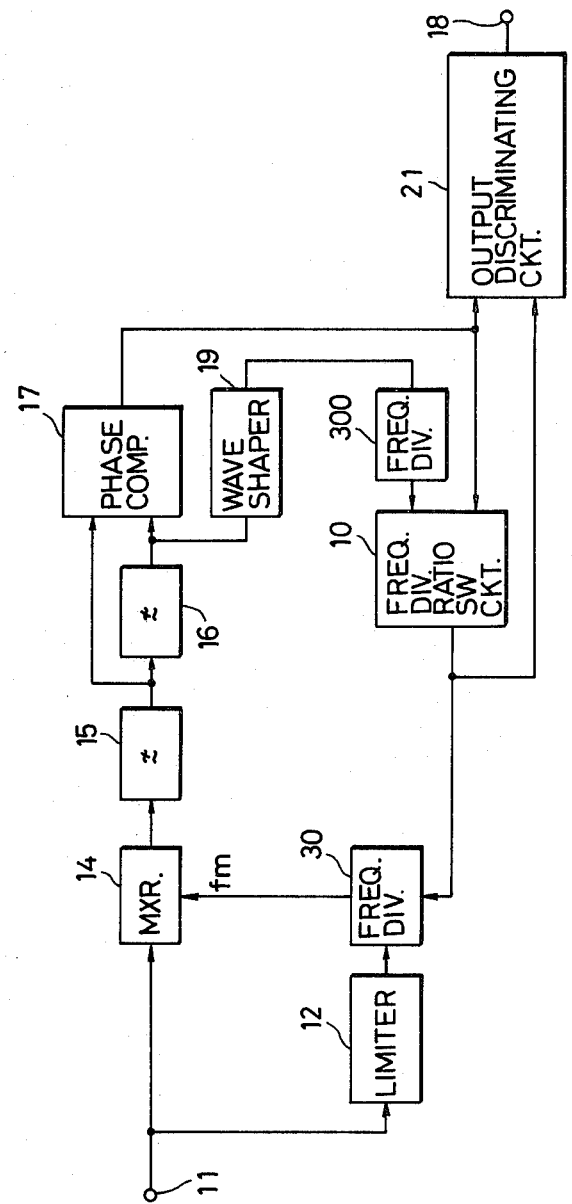
FIG. 9 is a block diagram of a second embodiment of a frequency discriminating circuit of the invention.

FIG. 9 is a block diagram showing an example of a frequency discriminating device constructed according to the second embodiment of the invention. Those components which are similar to those in FIG. 3 are designated by the same reference numerals and will not be described in detail. In FIG. 9, reference numeral 30 designates a first frequency divider the frequency division ratio of which can be set to either $N_1$ or $N_2$ and 300 indicates a second frequency divider which is connected through a waveform shaping circuit 19 to the second low-pass filter 16. The outputs of the second frequency divider 300 and the phase comparator 17 operate a frequency division ratio switching circuit 10 which sets the frequency division ratio of the first frequency divider 30. An output discriminating circuit 21 is provided which outputs a discrimination output according to the conditions of the outputs of the frequency division ratio switching circuit 10 and the phase comparator 17.

The frequency discriminating device thus constructed operates as follows:

It is assumed that the carrier frequency of an AM input signal applied to the input terminal 11 is $f_c$ and the modulation frequency is $f_1$ or $f_2$. The operations of the various circuit elements from the input terminal 11 to the phase comparator 17 are the same as those in FIG. 3. However, the frequency division ratio of the frequency divider 30 should satisfy one of the following conditions:

$$\left|f_1-\frac{f_c}{N_1}\right|<f_o<\left|f_2-\frac{f_c}{N_1}\right|, \text{ and} \quad (2)$$

$$\left|f_2-\frac{f_c}{N_2}\right|<f_o<\left|f_1-\frac{f_c}{N_2}\right|. \quad (3)$$

Thus, for the frequency division ratio $N_1$, the difference component between the signal having the frequency $f_1$ and the reference signal must be within the passband of the second low-pass filter, while for the frequency division ratio $N_2$, the difference component between the signal having the frequency $f_2$ and the reference signal must be within the passband of the second low-pass filter. Therefore, signals which are in phase with each other and are substantially equal in level are input to the phase comparator 17. When in-phase signals are input to the phase comparator 17, the output of the frequency division ratio switching circuit 10 is retained as it is. When the signals different in phase (including opposite in phase) are input to the phase comparator 17, the switching circuit 10 switches the frequency division ratio of the first frequency divider 30 to $N_1$ or $N_2$ at a repetitive frequency corresponding to the frequency division ratio $N_3$ of the second frequency divider 300 according to the output frequency of the second low-pass filter 16. That is, switching the frequency division ratio to $N_1$ or $N_2$ is repetitively carried out until a signal in the passband of the second low-pass filter 16 is obtained and the signals are detected as being in phase by the phase comparator 17. In this connection, as the second filter 16 is a low-pass filter, the fact that the signal is within the passband of the low-pass filter means that the repetitive frequency is decreased. Accordingly, in the case where the input signals are in phase with each other, the detection period of the phase comparator is increased.

By way of example, the operation of the frequency discriminating device in the case of a television sound multiplex broadcast will be described.

In this case, the carrier frequency is 55.125 kHz, the modulation frequency $f_1$ for stereo broadcasts is 982.5 Hz, while the modulation frequency $f_2$ for the split-channel (bi-lingual) broadcasts is 922.5 Hz. If $N_1=55$ and $N_2=61$, then the reference signal $f_m$ has a frequency of 1002.3 Hz ($f_{m1}$) in the case of the frequency division ratio $N_1$ and has a frequency of 903.7 Hz in the case of the frequency division ratio $N_2$.

Accordingly, the difference component $f_1-f_m$ for stereo broadcasts is 19.8 Hz for the frequency division ratio $N_1$ and 78.8 Hz for the frequency division ratio $N_2$. In contrast, the difference component $f_2-f_m$ for bilingual broadcasts is 79.8 Hz for the ratio $N_1$ and is 18.8 Hz for the ratio $N_2$. Therefore, if the cut-off frequency $f_o$ of the second low-pass filter 16 is set to 40 to 50 Hz, then the difference component is in the passband of the second low-pass filter 16 for the frequency division ratio $N_1$ in the case of stereo broadcasts, and it is in the passband for the ratio $N_2$ in the case of bilingual broadcasts.

When the difference component is in the passband, the output frequency division ratio switching circuit 10 is retained. Therefore, the stereo and bilingual broadcast signals can be discriminated by detecting whether the frequency division signal is $N_1$ or $N_2$.

When the difference component is out of the passband, the frequency division ratio switching circuit 10 switches $N_1$ over to $N_2$, or $N_2$ over to $N_1$. If, after this switching operation, the difference component is within the passband and in-phase signals are detected by the phase comparator 17 in a period of time which is approximately $N_3$ times 20 Hz, then the output of the frequency division ratio switching circuit 10 is retained. If the difference component is not within the passband even after the switching operation, the frequency division operations with the ratios $N_1$ and $N_2$ are repeatedly carried out at a period $N_3$. Thus, the value $N_3$, the time required for latching, is determined from the response characteristic of the phase comparator 17.

Figure 13:
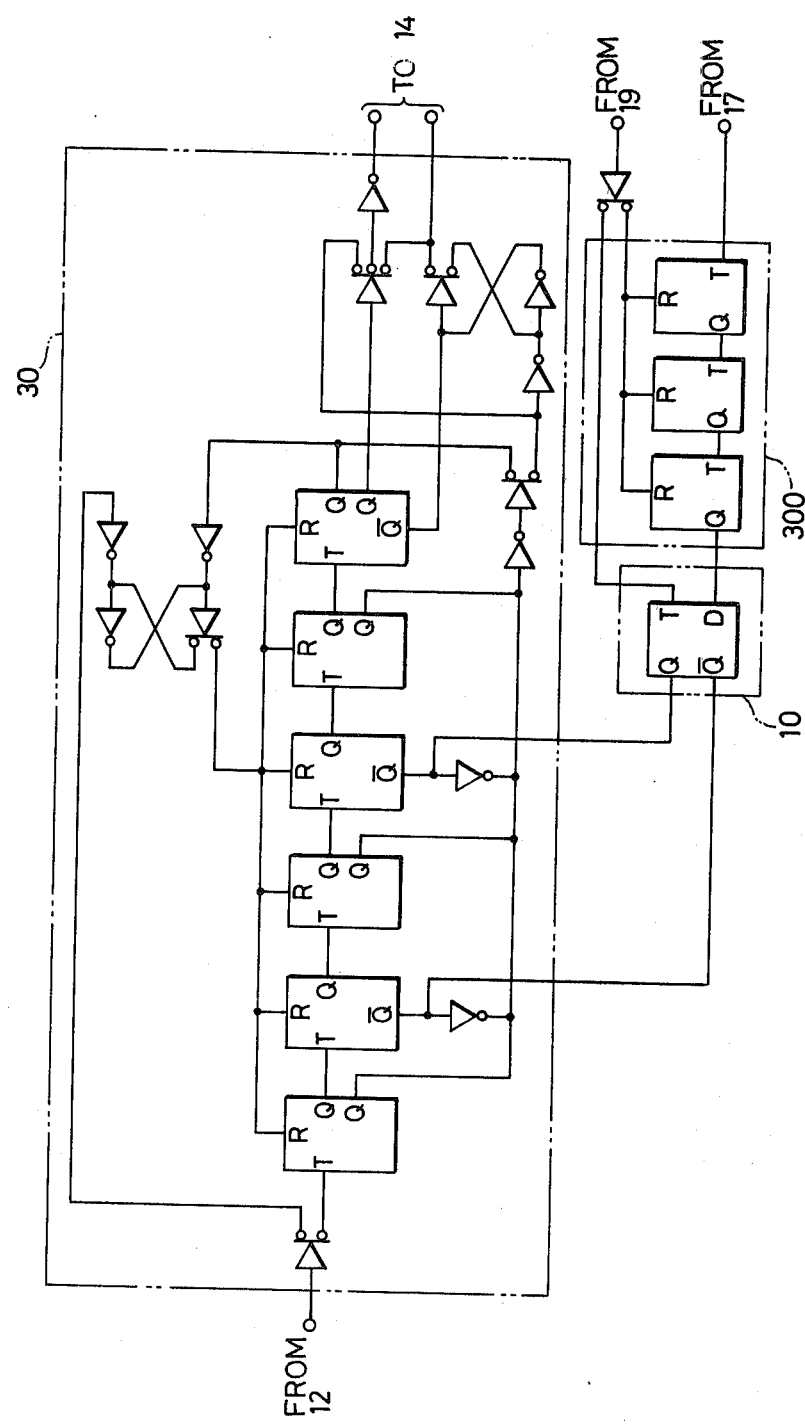
FIG. 13 is a detailed logic schematic diagram of portions of the circuits shown in FIG. 9.

FIG. 13 is a detailed logic schematic diagram showing an example of the construction of the frequency division ratio switching circuit 10, the frequency divider 30, and the frequency divider 300.

Figure 10:
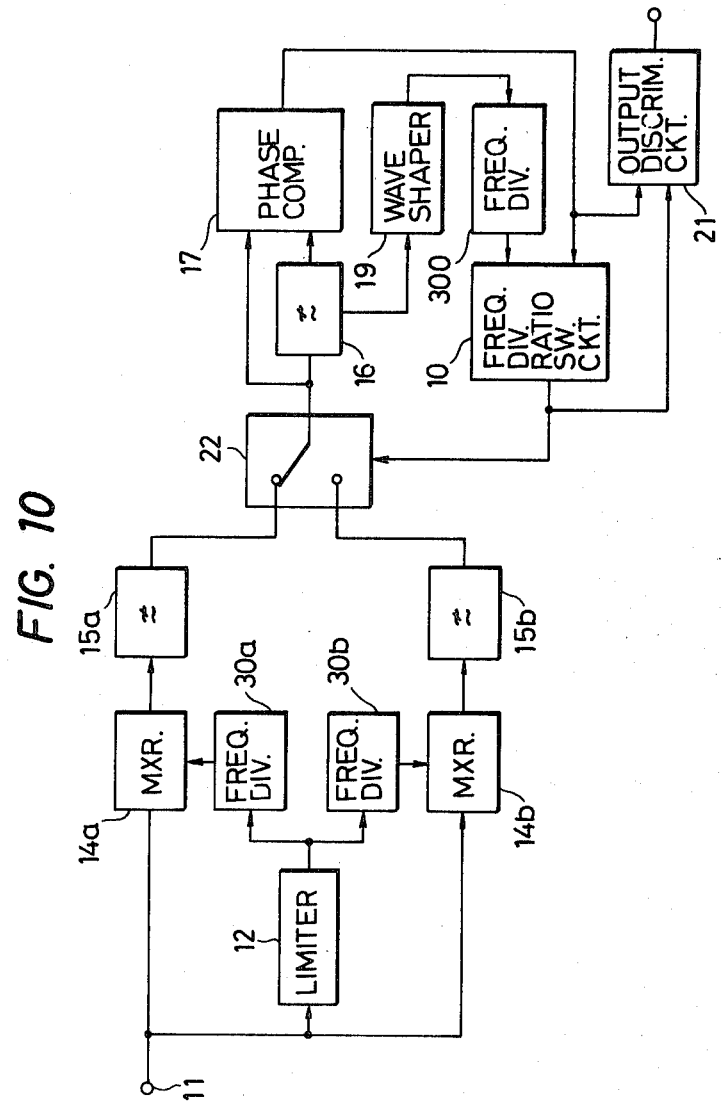
FIG. 10 is a block diagram of a third embodiment of a frequency discriminating circuit of the invention.

A third example of a frequency discriminating device of the invention is shown in FIG. 10. As is apparent from a comparison of FIG. 9 with FIG. 10, in the second example, instead of the first frequency divider, frequency dividers 30a and 30b having frequency division ratios $N_1$ and $N_2$, respectively, are provided instead of a single frequency divider. Also two frequency mixers 14a and 14b coupled, respectively, to the frequency dividers 30a and 30b are employed, and instead of the first low-pass filter, two first low-pass filters 15a and 15b connected respectively to the frequency mixers 14a and 14b are used. One of the outputs of the two first low-pass filters 15a and 15b in the two paths is applied to the second low-pass filter and the phase comparator 17 through a switching circuit 22 which receives the output of the frequency division ratio switching circuit 10.

In the FIG. 9 example, the frequency division ratio is directly switched. However, in the FIG. 10 example, the outputs of the signals corresponding to different frequency division ratios are switched with the same effect as that in the FIG. 9 example described above.

Thus, the frequency discriminating device of the invention operates at the correct level at all the times with a simple arrangement in which the frequency division ratio of the first frequency divider for frequency-dividing the AM input signal is changed in accordance with the output of the second frequency divider and the output of the phase comparator, thereby preventing erroneous operations which otherwise might occur when the electric field strength is low.

Figure 1:
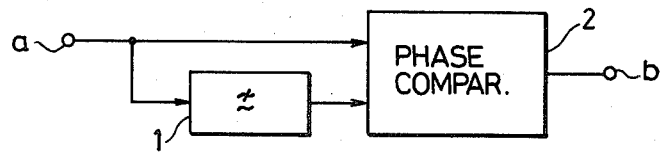
FIG. 1 is a block diagram showing a conventional frequency discriminating circuit.
Figure 2:
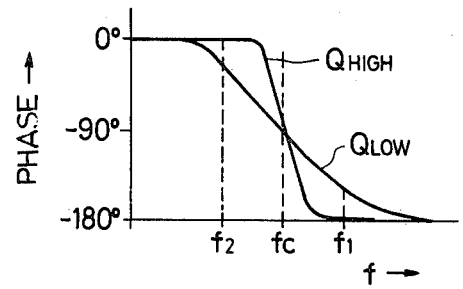
FIG. 2 is a graphical representation of the characteristics of the low-pass filter of FIG. 1.
Figure 11:
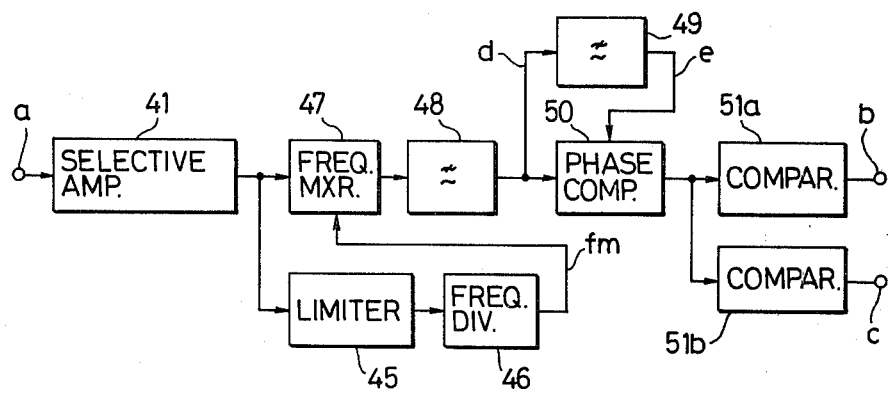
FIG. 11 is a block diagram of a fourth embodiment of a frequency discriminating circuit of the invention.

FIG. 11 is a block diagram showing the fundamental arrangement of a further frequency discriminating device according to the invention. In FIG. 11, reference numeral 41 designates a selective amplifier similar to that in FIG. 1, 45 a limiter, 46 a frequency divider, 47 a frequency mixer, 48 a first low-pass filter, 49 a second low-pass filter, 50 a phase comparator, and 51a and 51b voltage comparators.

A composite signal is applied to the selective amplifier 41 where only the AM signal at 55.125 kHz, or the discriminating signal, is amplified. Further, the signal of frequency 55.125 kHz is obtained through the limiter 45, and then subjected to 1/N frequency division by the frequency divider 46. It is preferable that N be 61 (N=61) for the reason described below.

As a result of the frequency division, a signal having a frequency $f_m$ is obtained. The signal of frequency $f_m$ and the original AM signal are applied to the frequency mixer 47. The output of the frequency mixer 47 is applied to the first low-pass filter 48. The difference component which is $|982.5-f_m|$ or $|922.5-f_m|$ is passed through the first low-pass filter 48. With N=61, $f_m$ is approximately 903.7 Hz, and the difference component is 78.8 Hz or 18.8 Hz.

The cut-off frequency $f_c$ of the second low-pass filter is set to a value between $982.5-f_m$ and $922.5-f_m$, i.e. between 18.8 Hz and 78.8 Hz in the case of N=1.

Figure 12:
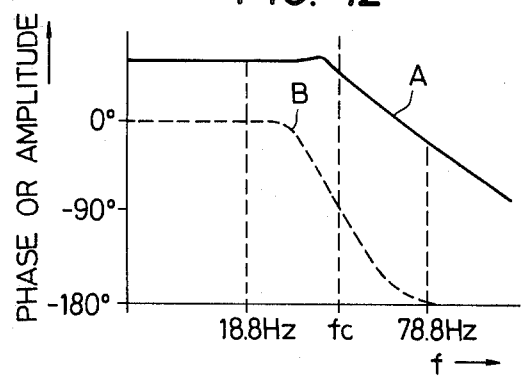
FIG. 12 is a graphical representation indicating characteristics of a second low-pass filter used in the embodiment of FIG. 11.

The output of the first low-pass filter 48 is applied directly to the phase comparator 50 and applied through the second low-pass filter 49 to the phase comparator 50. That is, the outputs of the first and second low-pass filters 48 and 49 are applied to the phase comparator 50 which detects changes in phase between the two outputs, whereby stereo broadcasts and split-channel broadcasts such as bilingual broadcasts are discriminated from the output of the phase comparator 50. FIG. 12 shows characteristics of the second low-pass filter 49. The same two-pole RC filter as shown in FIG. 7 may be used in this embodiment.

In this case, the cut-off frequency $f_c$ is $\frac{1}{2}\sqrt{R_1R_2C_1C_2}$, and the characteristics of the filter are indicated in FIG. 12. In FIG. 12, the curve A indicates the amplitude characteristic, and the curve B the phase characteristic. With respect to $|18.8-f_m|$ and $|78.8-f_m|$, the phase changes from 0° to $-180°$. Therefore, if the reference frequency $f_m$ is so selected that the difference between $|18.8-f_m|$ and $|78.8-f_m51|$ is as large as possible, then a frequency discriminating circuit which is little affected by fluctuation in values of resistors and capacitors and the Q characteristic of the filter is provided.

The employment of the frequency mixer 47 is effective as will become apparent from the following description. The case where the frequency mixer 47 is not used, i.e. the discriminating signal is directly subjected to AM detection and applied to the phase comparator 50 will be considered. In this case, the ratio of 982.5 Hz to 922.5 Hz is 1.065. Therefore, in order for the second low-pass filter 49 to provide a desired phase change, it is necessary to increase the accuracy and Q characteristic thereof and to provide a countermeasure against the drifts of the circuit elements when the cut-off frequency $f_c$ is set between 982.5 Hz and 922.5 Hz. On the other hand, in accordance with this embodiment of the invention, the discriminating signal is applied to the frequency mixer 47. Therefore, in the case of N=61, the frequencies phase-changed by the second low-pass filter 49 are 78.8 Hz and 18.8 Hz and the ratio of the frequencies is about 4.2. Accordingly, if the cut-off frequency of the second low-pass filter 49 is set to 40 to 45 Hz, then the Q may be of the order of five and the tolerances of the capacitors and resistors need be only 20%. In the case of N=60, the frequencies applied to the second low-pass filter 9 are 3.75 Hz and 63.75 Hz. Therefore, in this case, for an input signal of 3 Hz, the response characteristic is degraded because the transient characteristic is then unsatisfactory. Accordingly, in a practical application, it is suitable that N be 61, and for the second low-pass filter 49 to be designed such that $f_c=40$ or 45 Hz and Q=5.

As was described above, in the invention, when a stereo broadcast or a split-channel broadcast is discriminated by the amplitude-modulated control signal, the signal obtained by frequency-dividing the carrier signal of the control signal and the original AM signal are applied to the frequency mixer, the difference component between the frequency-divided signal and the modulation signal is passed by the first low-pass filter and applied to the second low-pass filter, and the outputs of the two low-pass filters are subjected to phase comparison by a phase comparator. Therefore, the phase difference between frequencies which are subjected to phase comparison can be large, thereby, providing discrimination with high accuracy and with ease.

What is claimed is:
1. A frequency discriminating device, comprising:
   a first frequency divider for frequency dividing a carrier signal of a received signal which is amplitude-modulated with one of two adjacent frequencies;

a frequency mixer receiving a frequency-divided output from said first frequency divider and said amplitude-modulated signal;

a first low-pass filter coupled to an output of said frequency mixer for passing only a difference component between the frequency of said output of said first frequency divider and the modulation frequency of said amplitude-modulated signal;

a second low-pass filter having an input coupled to an output of said first low-pass filter;

a phase comparator receiving an output of said first low-pass filter and receiving an output of said second filter for detecting a phase difference therebetween;

a second frequency divider for frequency dividing an output of said second filter; and a frequency division ratio switching circuit receiving a frequency-divided output of said second frequency divider and an output of said phase comparator, for setting a frequency division ratio of said first frequency divider.

2. The frequency discriminating device of claim 1, further comprising a limiter coupled between a source of said received signal and said first frequency divider.

3. The frequency discriminating device of claim 1, further comprising a wave shaping circuit connected between said second low-pass filter and said second frequency divider.

4. The frequency discriminating device of any of claims 1-3, further comprising an output discriminating circuit operating in response to outputs of said phase comparator and said frequency division ratio switching circuit.

5. The frequency discriminating device of any of claims 1-3, wherein said amplitude-modulated carrier signal has a carrier frequency of $f_c$ and is modulated with one of a modulation frequency of $f_1$ and $f_2$, said second low-pass filter has a cut-off frequency of $f_o$, and wherein the frequency division ratio of said first frequency divider is switchable between frequency division ratios $N_1$ and $N_2$, wherein, $$\left| f_1 - \frac{f_c}{N_1} \right| < f_o < \left| f_2 - \frac{f_c}{N_1} \right|, \text{ and}$$

$$\left| f_2 - \frac{f_c}{N_2} \right| < f_o < \left| f_1 - \frac{f_c}{N_2} \right|.$$

6. A frequency discriminating device, comprising:

a first frequency divider for frequency dividing a carrier signal of a received signal which is amplitude-modulated with one of two closely adjacent frequencies;

a first frequency mixer receiving a frequency-divided output from said first frequency divider and said amplitude-modulated signal;

a first low-pass filter coupled to an output of said frequency mixer for passing only a difference component between the frequency of said output of said first frequency divider and the modulation frequency of said amplitude-modulated signal;

a second frequency divider for frequency dividing said carrier signal of said received signal, said second frequency divider having a different frequency-division ratio than said first frequency divider;

a second frequency mixer receiving a frequency-divided output from said second frequency divider and said amplitude-modulated signal;

a second low-pass filter coupled to an output of said second frequency mixer for passing only a difference component between the frequency of said output of said second frequency divider and said modulation frequency of said amplitude-modulated signal;

switch means for outputting one of an output of said first low-pass filter and an output of said second low-pass filter in response to an input control signal;

a third filter receiving an output from said switch means;

a phase comparator receiving said output from said switch means and an output from said third filter for detecting a phase difference therebetween;

a third frequency divider for frequency dividing an output of said third filter; and a frequency division ratio switching circuit receiving a frequency-divided output of said third frequency divider and an output of said phase comparator for outputting said control signal for controlling the operative position of said switch means.

7. The frequency discriminating device of claim 6, further comprising a limiter coupling said amplitude-modulated signal to said first and second frequency dividers.

8. The frequency discriminating device of claim 6, further comprising a wave shaping circuit coupled between said third filter and said third frequency divider.

9. The frequency discriminating device of claim 6, further comprising an output discriminating circuit operating in response to said output of said phase comparator and said control signal.

10. The frequency discriminating device of any of claims 6-9, wherein said third filter comprises a low-pass filter having a cut-off frequency of $f_o$, wherein said amplitude-modulated signal is amplitude-modulated with a modulation frequency of one of $f_1$ and $f_2$, said amplitude-modulated signal has a carrier frequency of $f_c$, and wherein said first frequency divider has a frequency division ratio of $N_1$ and said second frequency divider has a frequency division ratio of $N_2$ wherein:

$$\left| f_1 - \frac{f_c}{N_1} \right| < f_o < \left| f_2 - \frac{f_2}{N_1} \right|, \text{ and}$$

$$\left| f_2 - \frac{f_c}{N_2} \right| < f_o < \left| f_1 - \frac{f_c}{N_2} \right|.$$

* * * * *

UNITED STATES PATENT AND TRADEMARK OFFICE
CERTIFICATE OF CORRECTION

PATENT NO. : 4,438,405
DATED : March 20, 1984
INVENTOR(S) : Nobuharu Yazawa et al It is certified that error appears in the above-identified patent and that said Letters Patent is hereby corrected as shown below:

[73] Assignee: "Nippon Gijutsu Boeki Co., Ltd." should be --Mitsubishi Denki Kabushiki Kaisha--.

Column 1, line 56, "freuquency" should be --frequency--.

Column 2, line 60, "must be have" should be --must have--;

line 62, "does not have" should be --do not have--.

Column 8, line 16, "$|78.8-f_m|$ 51" should be --$|78.8-f_m|$--.

[SEAL]

Signed and Sealed this

Twenty-first Day of August 1984

Attest:

Attesting Officer

GERALD J. MOSSINGHOFF
Commissioner of Patents and Trademarks